United States Patent
Baliga et al.

(10) Patent No.: US 6,519,272 B1
(45) Date of Patent: Feb. 11, 2003

(54) LONG, HIGH-POWER SEMICONDUCTOR LASER WITH SHIFTED-WAVE AND PASSIVATED OUTPUT FACET

(75) Inventors: Arvind Baliga, Winchester, MA (US); Dale C. Flanders, Lexington, MA (US); Randal Salvatore, Watertown, MA (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 09/689,011

(22) Filed: Oct. 12, 2000

Related U.S. Application Data

(63) Continuation-in-part of application No. 09/605,122, filed on Jun. 28, 2000.
(60) Provisional application No. 60/141,895, filed on Jun. 30, 1999.

(51) Int. Cl.⁷ ................................................. H01S 5/00
(52) U.S. Cl. ...................................................... 372/49
(58) Field of Search .............................. 372/49, 45–46

(56) References Cited

U.S. PATENT DOCUMENTS

| | | | |
|---|---|---|---|
| 4,337,443 A | | 6/1982 | Umeda et al. ................. 372/49 |
| 4,731,792 A | * | 3/1988 | Shimizu et al. ............... 372/49 |
| 4,843,610 A | * | 6/1989 | Okada et al. .................. 372/31 |
| 4,975,922 A | * | 12/1990 | Sakane et al. ................ 372/49 |
| 5,144,634 A | * | 9/1992 | Gasser et al. ................. 372/49 |
| 5,574,743 A | * | 11/1996 | van der Poel et al. ........ 372/46 |
| 5,923,690 A | * | 7/1999 | Kume et al. ................... 372/46 |
| 5,940,424 A | | 8/1999 | Dietrich et al. ............... 372/49 |
| 6,052,397 A | * | 4/2000 | Jeon et al. ..................... 372/46 |

OTHER PUBLICATIONS

James Guthie, et al., "Beam Instability in 980–nm Power Lasers: Experiment and Analysis," *IEEE Photonics Technology Letters*, 6(12):1409–1411 (Dec. 1994).

ten Cate, J.W.R., et al., "Kinks Induced by Free–Carrier Absorption in Weakly Index Guided Semiconductor Lasers," *Appl. Phys. Lett.* 71 (1), pp. 19–21, (Jul. 7, 1997).

\* cited by examiner

*Primary Examiner*—Paul Ip
*Assistant Examiner*—James Menefee
(74) *Attorney, Agent, or Firm*—Hamilton, Brook, Smith & Reynolds, P.C.

(57) ABSTRACT

A semiconductor electro-optical device such as a laser or modulator comprises a ridge of active and wave-guiding semiconductor layers extending between two facets. In the preferred embodiment, cavity length is relatively long, i.e., the facets are separated by greater than a millimeter. This lowers the current densities in the ridge for the same output beam power. Further, an oxygen-free passivation layer is continuously formed over at least one of the facets to prevent surface corrosion and avoid electrical surface traps. However, a standing-wave-shifted coating is further used on the facet with the passivation layer to reduce the electric field magnitude in the passivation layer.

15 Claims, 6 Drawing Sheets

LONG, HIGH-POWER SEMICONDUCTOR LASER WITH SHIFTED-WAVE AND PASSIVATED OUTPUT FACET

RELATED APPLICATIONS

This application is a continuation-in-part of U.S. patent application Ser. No. 09/605,122, filed Jun. 28, 2000 which claims the benefit of U.S. Provisional Application No. 60/141,895, filed Jun. 30, 1999. The entire teachings of the above-referenced applications are incorporated herein by reference.

BACKGROUND OF THE INVENTION

The useful power output and life-expectancy at operational power levels are two metrics for comparing the performance of semiconductor lasers. One short-hand measure of the long-term reliability of the laser device is the electronic overstress (EOS) level. This refers to the light output at which the laser device is irreversibly damaged. In contrast, useful power output is typically measured by the device's kink power. The useful operating power of laser devices is limited in many applications by a "kink" in the power versus current dependence above the lasing threshold, and weakly-guided semiconductor devices, such as ridge waveguide lasers, are particularly susceptible to these kinks. Kink definitions vary greatly but typically correspond to deviations of approximately 20% from a linear dependence above the threshold.

Various techniques have been employed to optimize EOS levels and kink powers, but typically, tradeoffs are involved. For example, power density along the ridge and output facet heating typically dictate the EOS level since output facet destruction is a common failure mode. Widening the ridge decreases power density for the same current levels along the ridge and increases the size of the facet to thereby similarly decrease heating per unit area, increasing the EOS level.

Wider ridges, however, are more susceptible to kinks. A number of different theories have been proposed to explain the kink in the power vs. current dependence. The theories agree insofar as there appears to be a shift of the eigenmode space at the higher currents that affects the total optical output and/or how the output is coupled into a fiber transmission media. Generally, wider ridges are less capable of preventing these shifts.

Another technique for raising the EOS level is sometimes referred to as the E2 process. This involves the vacuum cleaving, i.e., in an oxygen-free atmosphere, followed by the deposition of a thin, silicon layer on the output facet. The underlying theory is that corrosion and electrical surface traps, resulting from crystal defects, dissipate energy at the output facet causing degradation and ultimately catastrophic failure. The silicon layer undermines both of these mechanisms, but the increase in performance is typically less than anticipated since the silicon layer itself is absorptive. Therefore, with this technique, one mode of power dissipation at the facet is simply substituted for another, albeit less, detrimental mode.

SUMMARY OF THE INVENTION

The present invention concerns a semiconductor electro-optical device such as a laser or modulator, preferably a 980 nm pump laser that is used to optically pump a gain fiber such as erbium-doped fiber. It comprises a ridge of active and wave-guiding semiconductor layers extending between two facets. In the preferred embodiment, cavity length is relatively long, i.e., the facets are separated by greater than a millimeter. This lowers the current densities in the ridge for the same output beam power. Further, an oxygen-free passivation layer is formed over at least one of the facets to prevent surface corrosion and avoid electrical surface traps. However, a standing-wave-shifted coating is further used on the facet with the passivation layer to reduce the electric field magnitude in the passivation layer.

The p-metal layer, which is used to conduct a ridge-injection current, is preferably greater than 0.2 $\mu$m in thickness. This helps to control thermal lensing and thereby increase kink powers. The layer is preferably evaporated gold followed by gold plating, and can be as thick as 1.5 $\mu$m. Further, a tapered ridge is preferably used to protect the facet while controlling kinks.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the drawings, like reference characters refer to the same parts throughout the different views. The drawings are not necessarily to scale, emphasis instead being placed upon illustrating the principles of the invention. Of the drawings.

DETAILED DESCRIPTION OF THE INVENTION

General Laser Structure

Figure 1:
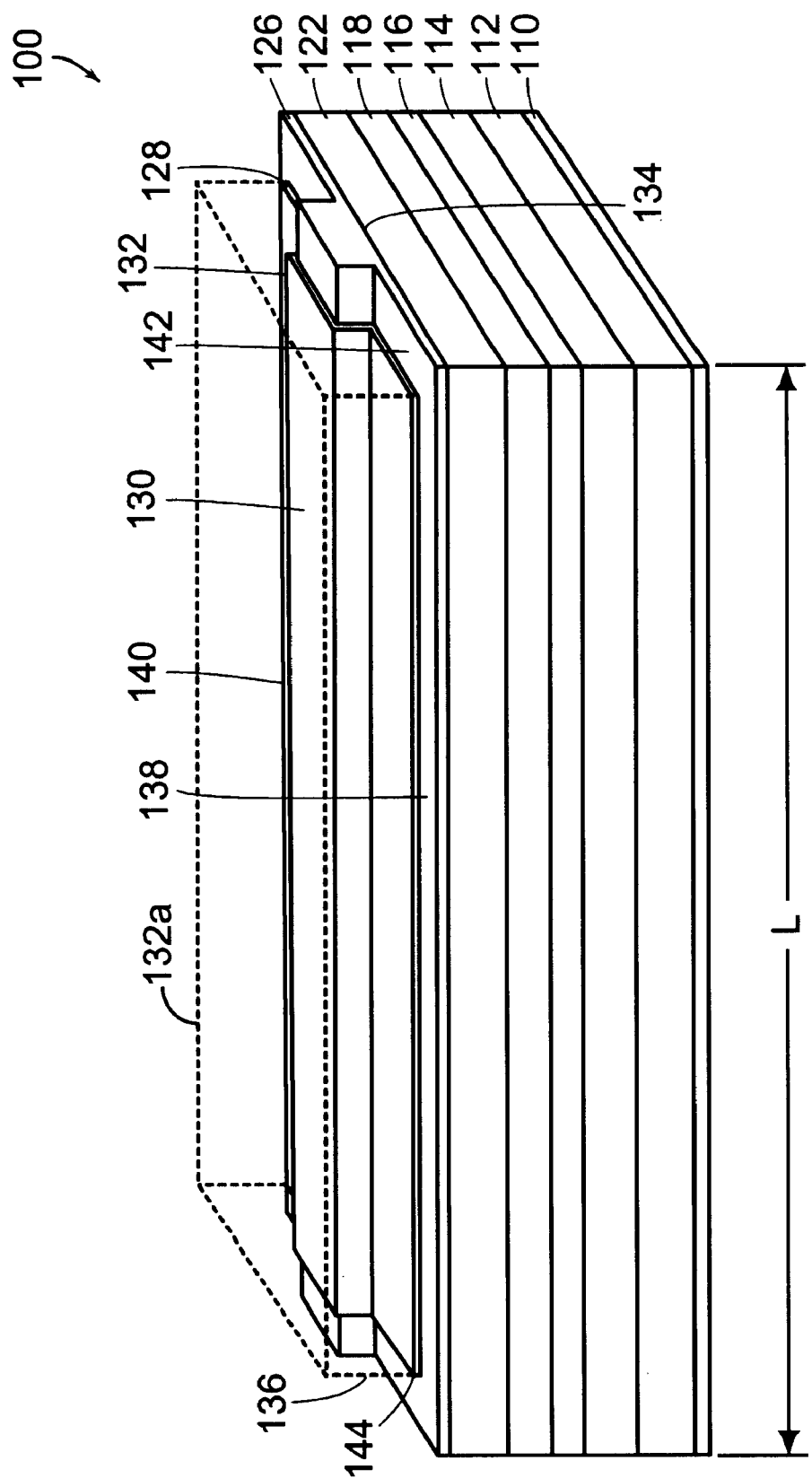
FIG. 1 is a perspective view of an electro-optical device according to the present invention.

FIG. 1 illustrates the general structure of a semiconductor laser 100 to which the preferred embodiment of the present invention is applied. Generally, the laser comprises an N-metal contact layer 110 on the bottom of an N-type substrate 112. An epitaxial buffer layer 114 is grown on substrate 112, followed by a lower N-type cladding layer 116. At the core of the laser is a graded N-type region 118 along with an undoped quantum well 120 and a graded P-type region 122. A ridge 130 is formed in an upper cladding layer 126. On the top of the ridge is a contact layer 128 and a trimetal titanium-platinum-gold P-metal contact layer 132.

At the cleaved ends of the device 100 are facets 134, 136. In the typical implementation, the front facet 134 is only partially reflecting, $R_A$=10%, and the rear facet 136 is made with significantly stronger reflection, $R_H=90\%$. This permits a great majority of the laser power to be emitted from the front facet. In other embodiments, however, both facets can have an intended low reflectivity, i.e., include antireflective coatings, for implementation in a Faber Perot-type configuration, for example.

Cavity Length

According to the present invention, the length L between the front and rear facets 134, 136 is greater than a millimeter. Particularly, in the preferred embodiment, the length is approximately 1.5 millimeters (mm).

Conventionally, cavity lengths are limited to less than 750 micrometers ($\mu$m). The justification is that, even though longer cavities may potentially decrease the current densities at a given optical output power, there is no net benefit with limitations in conventional fabrication techniques. This is because defects in the bulk epitaxial semiconductor material, particularly of the graded regions 118, 122, undermine any gain increase associated with the longer cavity. This thinking continues today, even though bulk defects have been lowered with new epitaxial crystal growth techniques.

Figure 2A:
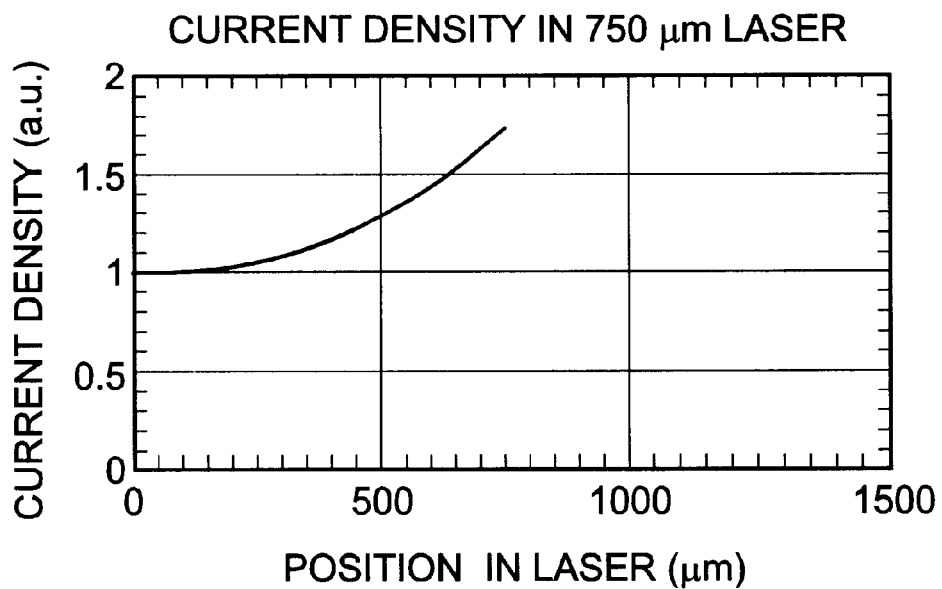
FIGS. 2A and 2B are plots of current density (arbitrary units) as a function of location in the laser in micrometers for conventional length and the inventive long cavity laser.
Figure 2B:
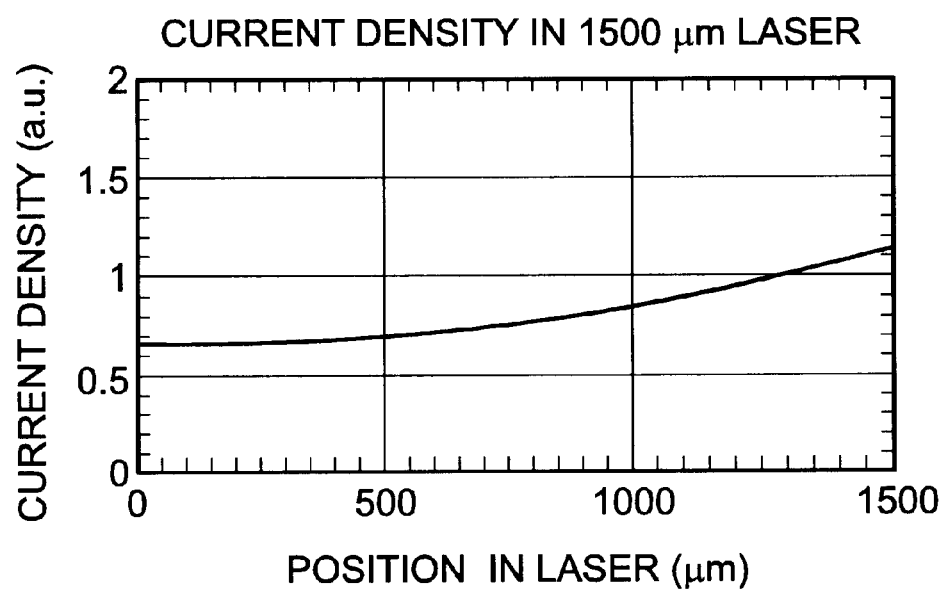

FIGS. 2A and 2B are plots of current density as a function of position in the laser in micrometers for a 750 $\mu$m length laser (FIG. 2A) and the inventive 1500 $\mu$m length laser (FIG. 2B). These graphs demonstrate that the power of the longer laser can be raised 80% before the same current density is required.

Standing-Wave-Shifted (SWS) Facet Coating

Figure 3:
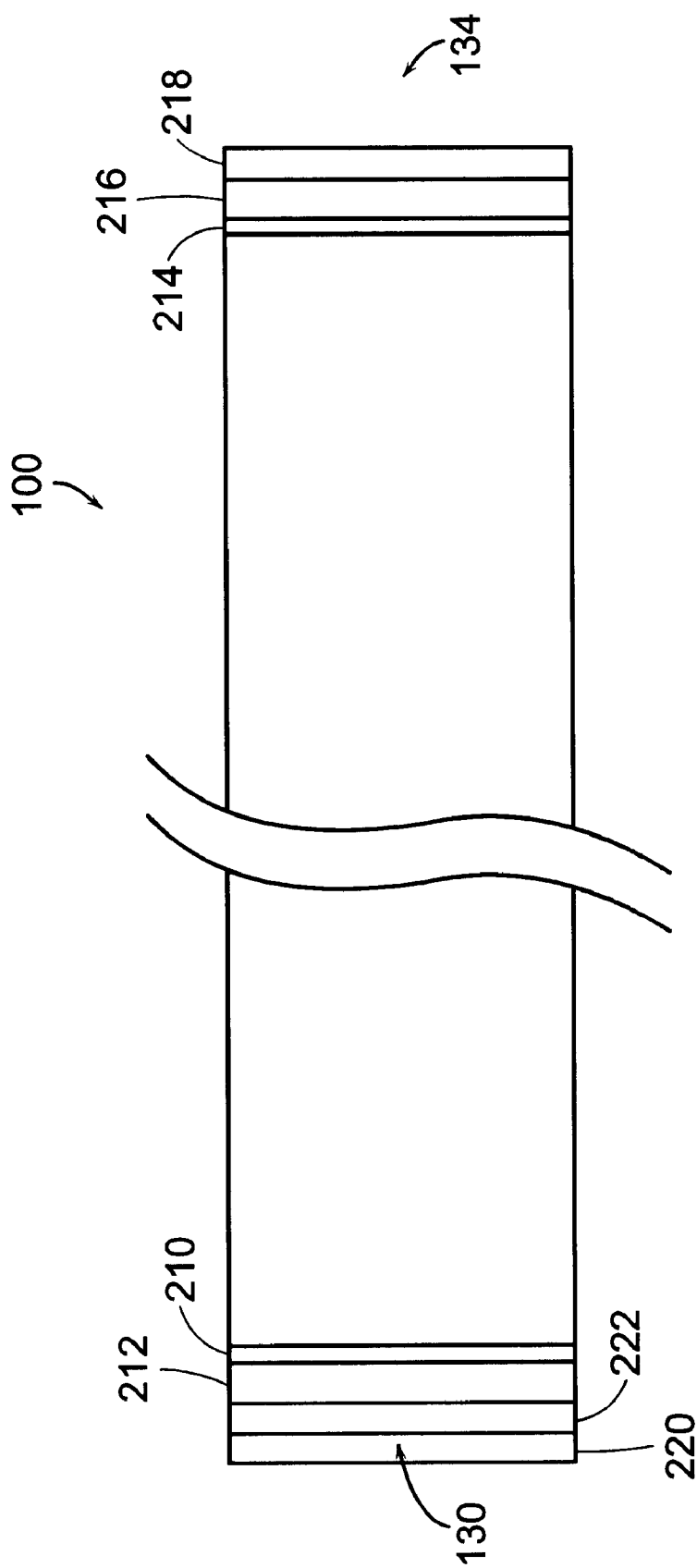
FIG. 3 is a horizontal longitudinal cross-section of the electro-optical device showing the facet coatings.

FIG. 3 shows the facet coatings used in the electro-optical device 100 of the present invention.

As is conventional, the cleaved surface of the epitaxial AlGaAs facets 134, 136 are coated with a passivation layer 214, 210 to protect the facet surface from corrosion and reduce the number of electrical surface traps resulting from crystal defects. Typically, the coating is silicon, germanium, or antimony.

An important aspect of the coating process is a contamination-free atmosphere. Typically, this is accomplished by cleaving and depositing the passivation layer in a vacuum system with an adequately low base pressure. U.S. Pat. Nos. 5,144,634 and 5,063,173 to Gasser, et al. detail the method for passivation in semiconductor laser diodes. Both of these patents are incorporated herein by this reference in their entirety.

The major problem with the passivation technique, however, is that the silicon is absorptive to the radiation having wavelength shorter than 1.1 $\mu$m. This effect is compounded when aluminum oxide film is used as the reflective coating. The electric field intensity peaks in or near the passivation layer. Thus, in prior art systems, even though peak light output could be increased by lengthening the laser cavity, the likelihood of output facet destruction was similarly increased with this passivation technique.

As shown in FIG. 3, the silicon coating 210, 214 is evaporated onto both the front and rear facets 136, 134 of the laser 100. On the back facet 136, an aluminum oxide $Al_2O_3$ layer 212 and alternating layers of a $SiO_2$ 220 and a $TiO_2$ layer 222 are provided to yield the reflectivity of greater than 90%. Alternatively, silicon oxide or titanium oxide could also be used. This is conventional.

According to the present invention, titanium oxide and/or aluminum oxide layers 216, 218 are deposited on the front facet 134 on the silicon layer 214. The thicknesses of the two outer layers are approximately one-quarter of the wavelength of the output light of the laser 100. The effect is to reduce the magnitude of the electric field at the silicon passivation layer 214 and therefore prevent destructive facet heating arising from absorption in the silicon passivation layer.

In the preferred embodiment, for a pump laser in the 980 nm band, the standing wave shifted coating comprises a thin layer of aluminum oxide 216 and a titanium oxide layer 218. In the preferred embodiment, they are 150 and 800 Angstroms (Å) thick, respectively. Alternatively, a thick layer of aluminum oxide followed by a titanium oxide layer is another possibility. In this case, the aluminum oxide is 2960 Å thick, and the titanium oxide is 1000 Å thick, in the preferred embodiment. In a final embodiment, only a single layer of titanium oxide is used over the silicon layer 214. In this case, the preferred embodiment uses an oxide layer of 960 Å in thickness. In each of these case, to light within the semiconductor, the effective index of the adjacent material ($n_{eff}$) appears to be greater than that of the semiconductor ($n_s$). This is accomplished through the impedance transformation behavior of the dielectric layers. The dielectric layers thus create a negative field reflectivity $r=(n_s-n_{eff})/(n_s+n_{eff})$ which forces a standing wave minimum to occur at the passivation layer.

Figure 4A:
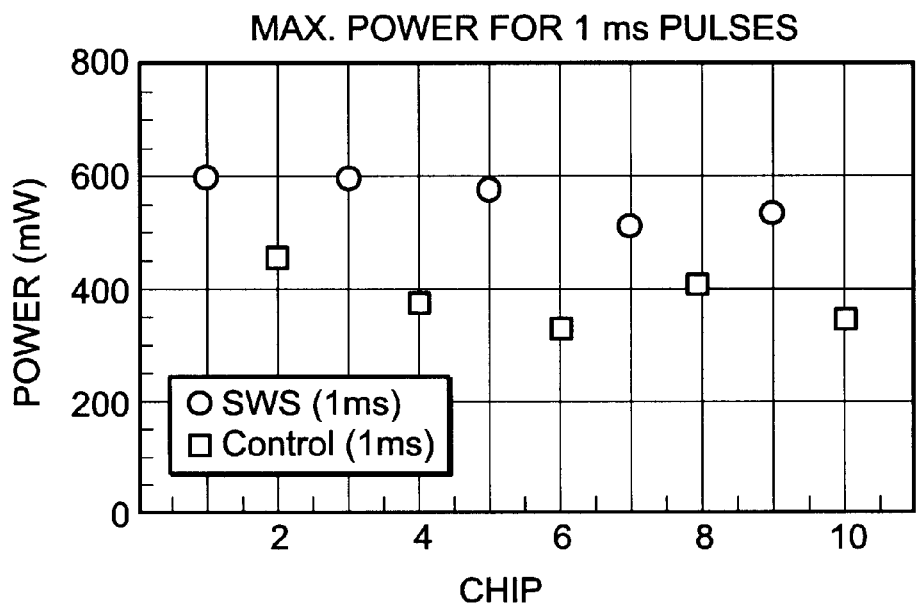
FIGS. 4A and 4B are plots of power in milliWatts and current in milliAmperes, respectively, to show the increased performance with the SWS coating over control devices.
Figure 4B:
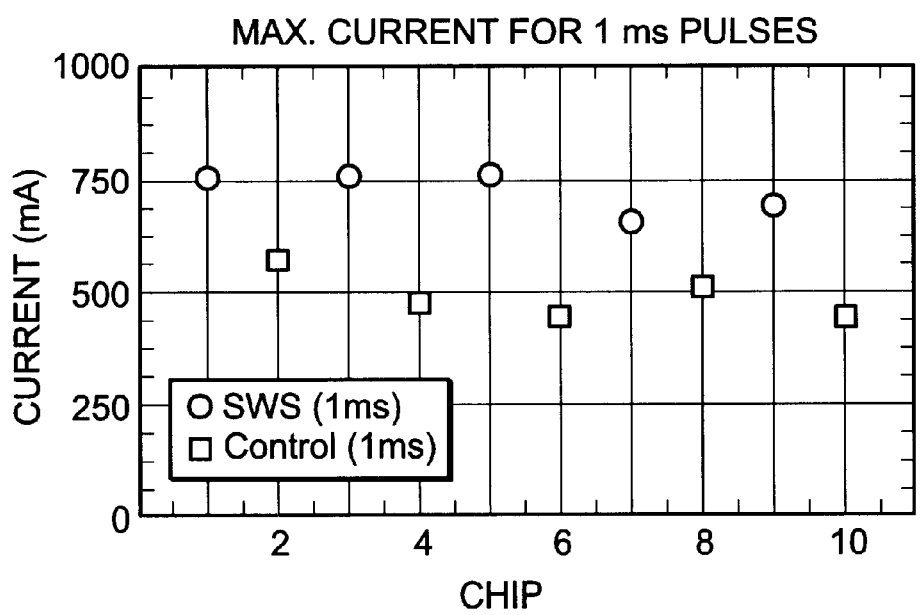

The advantages of using the SWS coatings are illustrated in FIGS. 4A and 4B. These are plots of the power in milliWatts and current in milliamps for various chips. As shown, the chips with the SWS coating (○ data points) support higher currents for the one millisecond long pulses than the control group (□ data points).

In summary, the chip lengthening coupled with the SWS coatings yield higher sustainable power levels, which are measured in the increase in the EOS level for the semiconductor electro-optical devices. The longer cavities allow the devices to use higher light output without creating destructive current densities within the device. The SWS facet coating protects the facet by reducing the facet heat generated at a given power level.

The following two components of the invention are intended to facilitate kink performance.

P-Metal Layer Thickness

Thermal gradients within the laser and the subsequent thermal lensing effect cause the shift in the eigenmode space which leads to the kinks in the power versus current dependance. Attempts have been made to minimize this lensing by avoiding the generation of thermal gradients. For example, in the past, the chips are mounted upside-down so that the P-metal layer is in direct contact with a heat sink. This approach, however, is costly to implement and leads to fiber coupling/alignment problems.

According to the preferred embodiment, the tri-metal P-contact layer 132 is augmented with a thick gold layer 132a (shown in phantom) to reduce thermal gradients, extending the power range over which single mode operation exists. The gold is deposited via evaporation and a plate over the ridge. The total thickness is greater than 0.2 microns. In the preferred embodiment, the plating is approximately 0.45 $\mu$m thick to approximately 1.5 $\mu$m. Further, lateral scribe lanes 138, 140 are helpful on either side of the ridge 130 to facilitate bar separation. Further front and rear scribe lanes 142, 144 are preferred to facilitate chip separation.

Figure 5A:
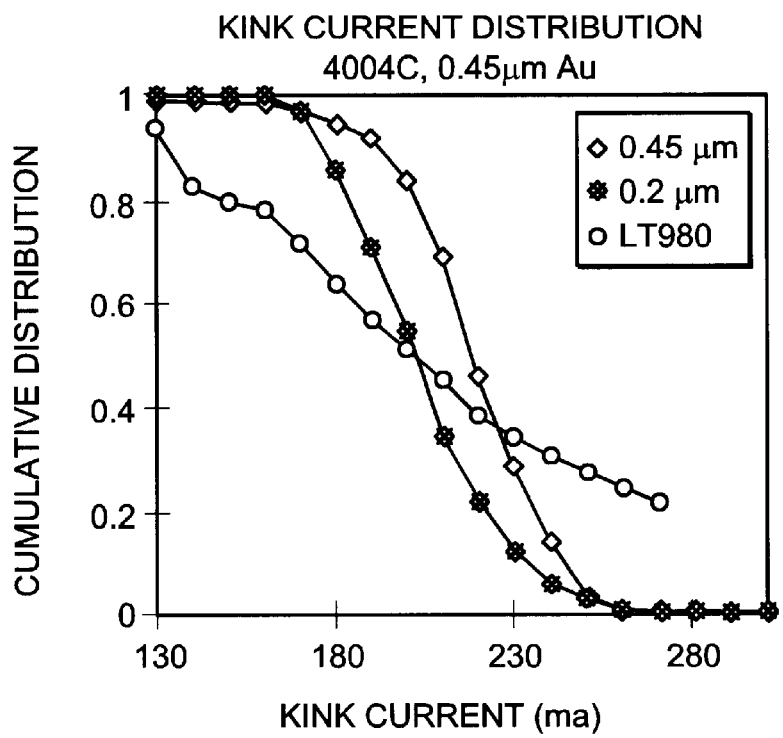
FIGS. 5A and 5B illustrate the kink current distribution for various p-metal layer thicknesses.
Figure 5B:
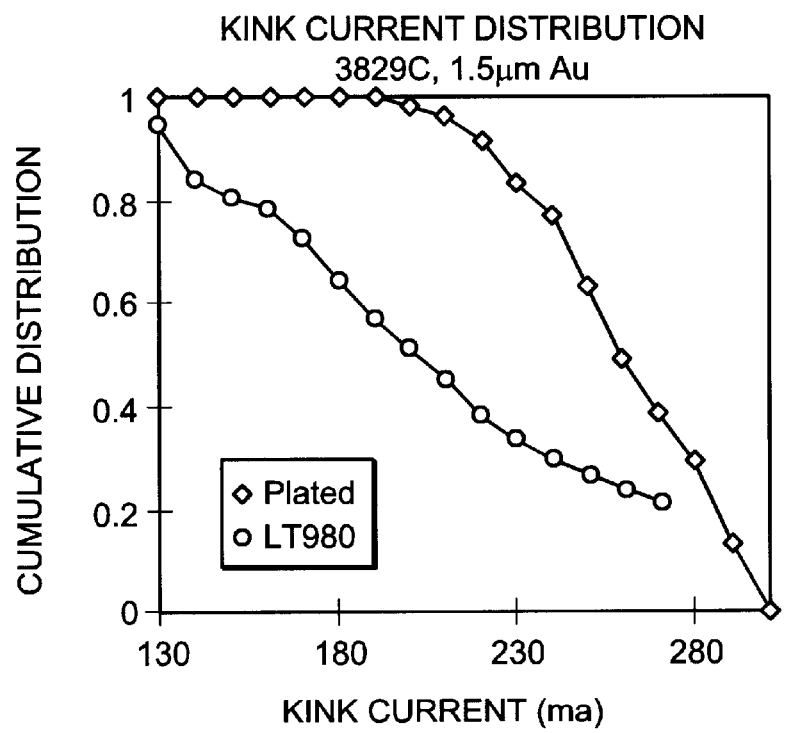

FIG. 5A is a plot of the cumulative distribution as a function of kink current in milliAmps, illustrating the better kink performance achieved with thicker p-metal layer. Specifically, the increase of 0.2 $\mu$m and 0.45 $\mu$m in gold thickness by plating raises the kink current (measured in milliamps) for the typical electro-optical device. FIG. 5B shows further improvements in the distribution when 1.5 $\mu$m thick gold plate is used.

Adiabatic Taper

Figure 6:
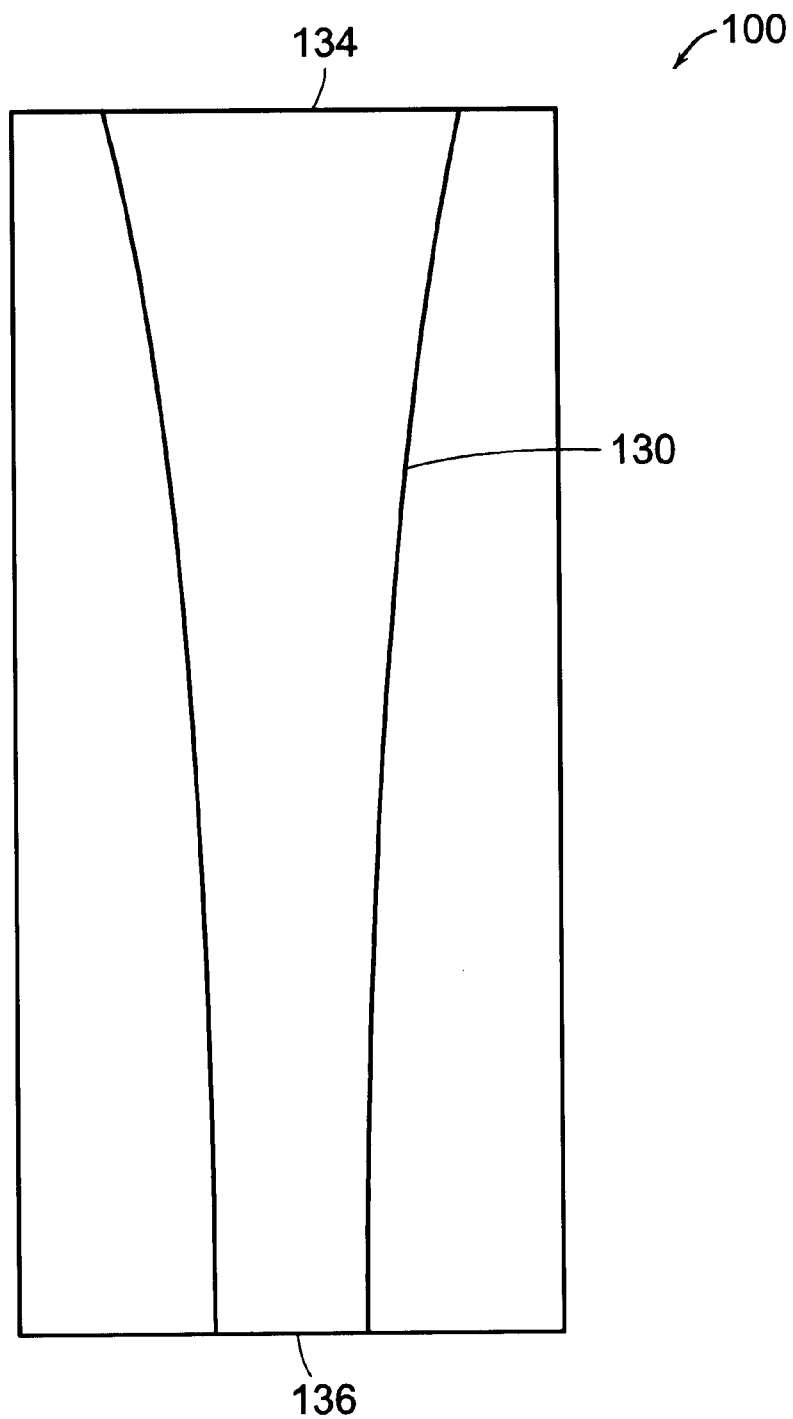
FIG. 6 is a top plan view showing the adiabatic tapered ridge in the preferred embodiment.

The final optimization is the characteristics of the ridge to facilitate transverse mode control and therefore optimize kink performance. FIG. 6 is a top view of the ridge 130. In the preferred embodiment, the ridge has an adiabatic taper in the direction of the rear facet 136. This provides a wider front facet to decrease heating per unit area at the output facet 134. The back facet 136, however, is kept small to control the transverse modes and thereby increase the kink power. In the preferred embodiment, the ridge width is between 4 and 6 $\mu$m, 5 $\mu$m in the preferred embodiment. The ridge flare is between 250 and 450 $\mu$m along the length of the device 100, flaring to a width of 6 to 10 $\mu$m.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor electro-optical device, comprising:

an active layer;

a ridge waveguide extending between two facets;

a p-metal layer for conducting a ridge-injection current to the ridge, which is greater than 0.6 $\mu$m in thickness to reduce thermal gradients;

an oxygen-free passivation layer formed over at least one of the facets; and a standing-wave-shifted coating having a layer which is approximately one quarter of wavelength of laser light on the facet with the passivation layer to reduce the electric field magnitude in the passivation layer.

2. A semiconductor electro-optical device as claimed in claim 1, wherein the standing-wave-shifted coating comprises $Al_2O_3$ and $TiO_2$.

3. A semiconductor electro-optical device as claimed in claim 1, wherein the standing-wave-shifted coating consists essentially of a $TiO_2$ layer.

4. A semiconductor electro-optical device as claimed in claim 1, wherein the p-metal layer is formed from evaporated gold.

5. A semiconductor electro-optical device as claimed in claim 1, wherein the p-metal layer is approximately 1.5 $\mu$m in thickness.

6. A semiconductor electro-optical device as claimed in claim 1, wherein the p-metal layer is plated over the ridge and comprises scribe lanes.

7. A semiconductor electro-optical device as claimed in claim 1, wherein the ridge is tapered in the direction of the rear facet.

8. A semiconductor electro-optical device as claimed in claim 1, wherein the ridge is longer than a millimeter.

9. A semiconductor electro-optical device as claimed in claim 3, wherein the ridge is about 1.5 millimeters or longer.

10. A semiconductor electro-optical device, comprising:

an active layer;

a ridge waveguide extending between two facets, the ridge being longer than a millimeter to increase an electronic overstress level at a power output by reducing current density;

an oxygen-free passivation layer formed over at least one of the facets; and a standing-wave-shifted coating having a layer which is approximately one quarter of wavelength of laser light for reducing a magnitude of an electrical field in the passivation layer.

11. A semiconductor electro-optical device as claimed in claim 10, further comprising a p-metal layer for conducting a ridge-injection current, which is greater than 0.2 $\mu$m in thickness.

12. A semiconductor electro-optical device as claimed in claim 11, wherein the p-metal layer is formed from evaporated gold.

13. A semiconductor electro-optical device as claimed in claim 10, further comprising a p-metal layer for conducting a ridge-injection current, which is approximately 0.4 $\mu$m or greater in thickness.

14. A semiconductor electro-optical device as claimed in claim 10, further comprising a p-metal layer for conducting a ridge-injection current, which is approximately 1.5 $\mu$m in thickness.

15. A semiconductor electro-optical device as claimed in claim 10, wherein the ridge is about 1.5 millimeters long.

* * * * *